United States Patent
Wohlfahrt et al.

(10) Patent No.: US 7,187,602 B2
(45) Date of Patent: Mar. 6, 2007

(54) REDUCING MEMORY FAILURES IN INTEGRATED CIRCUITS

(75) Inventors: Joerg Wohlfahrt, Kanagawa (JP);
Thomas Roehr, Kanagawa (JP);
Michael Jacob, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/250,211

(22) Filed: Jun. 13, 2003

(65) Prior Publication Data

US 2003/0179616 A1 Sep. 25, 2003

(51) Int. Cl.
*G11C 29/42* (2006.01)
*G11C 29/04* (2006.01)
*G11C 29/24* (2006.01)
*G11C 11/22* (2006.01)

(52) U.S. Cl. ............... 365/200; 365/201; 365/225.7; 365/145; 714/710; 714/764; 714/6; 714/7; 714/8

(58) Field of Classification Search ........... 365/200, 365/201, 225.7, 230.06, 145; 714/710, 711, 714/763, 768, 764, 6, 7, 8
See application file for complete search history.

(56) References Cited

U.S. PATENT DOCUMENTS

| | | | | |
|---|---|---|---|---|
| 4,493,075 A | * | 1/1985 | Anderson et al. | 365/200 |
| 4,768,193 A | * | 8/1988 | Takemae | 714/711 |
| 4,939,694 A | * | 7/1990 | Eaton et al. | 365/200 |
| 5,134,616 A | * | 7/1992 | Barth et al. | 714/711 |
| 5,278,847 A | * | 1/1994 | Helbig et al. | 714/764 |
| 5,463,244 A | * | 10/1995 | De Araujo et al. | 257/530 |
| 5,903,492 A | | 5/1999 | Takashima | |
| 6,704,228 B2 | * | 3/2004 | Jang et al. | 365/200 |
| 6,751,137 B2 | * | 6/2004 | Park et al. | 365/200 |
| 2004/0095798 A1 | | 5/2004 | Wohlfahrt et al. | |

OTHER PUBLICATIONS

Taylor et al., "A 1-Mbit CMOS Dynamic RAM with Divided Bitline Matrix Architecture", IEEE Journal of Solid-State Circuits, vol. SC-20, No. 5, Oct. 1985, p. 894-902.

* cited by examiner

Primary Examiner—J. H. Hur
(74) Attorney, Agent, or Firm—Horizon IP Pte Ltd

(57) ABSTRACT

Memory reliability is improved by using redundancy to repair errors detected by ECC. In one embodiment, redundancy repairs errors which cannot be corrected by ECC. The redundancy can employ the use of electronic fuses, enabling repairs after an IC containing the memory is packaged. Redundancy can also be performed prior to packaging of the IC.

22 Claims, 4 Drawing Sheets

REDUCING MEMORY FAILURES IN INTEGRATED CIRCUITS

BACKGROUND OF INVENTION

Non-volatile memory cells, such as ferroelectric memory cells, are used in semiconductor memory devices. Such ferroelectric memory cells employ the use of ferroelectric metal oxide ceramic materials, such as lead zirconate titanate (PZT). Other types of ferroelectric material, such as Strontium-bismuth-tantalate (SBT) or lead-lanthanum-zirconium-titanate (PLZT) may also be used. FIG. 1 shows a ferroelectric memory cell 105 having a transistor 130 and a ferroelectric capacitor 140. A capacitor electrode 142 is coupled to a plateline 170 and another capacitor electrode 141 is coupled to the transistor which selectively couples or decouples the capacitor from a bitline 160, depending on the state (active or inactive) of a wordline 150 coupled to the transistor gate. A plurality of memory cells are interconnected by wordlines, bitlines, and plateline(s). Support circuitry is provided to facilitate access to the memory cells.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

The memory cells can be accessed by, for example, a processor to retrieve information (e.g., data word). The width of the data word depends on the memory architecture. For example, the width of the word can equal to 4 bits. Other data word lengths can also be useful. When a data word is accessed, errors may occur. For example, 1 bit of the data word can be erroneous due to a defective memory cell. To avoid or reduce the probability of a system failure due to defective memory cells, error correction codes (ECC) or techniques are employed. ECC techniques detect and correct, if possible, errors in a data word. The number of erroneous bits in a data word which can be corrected depends on the error correction technique employed.

As can be seen, ECC can enhance the operational reliability by correcting errors in a data word. However, in the event that the number of errors in a data word exceed the capabilities of a particular ECC, a system failure would occur. For example, for ECC capable of repairing one bit, a second failing bit within the accessed data word would lead to a total failure.

From the foregoing discussion, it is desirable to avoid or reduce failures caused by memory errors in ICs.

SUMMARY OF INVENTION

The invention relates to improving reliability of memory. More particularly, the invention relates to improving reliability using error correction and redundancy. In one embodiment, a method of improving memory reliability comprises retrieving a data word from memory. Error correction code is used to determine if the data word contains any errors or not. If the data word contains an error, memory redundancy is used to repair at least the memory cell corresponding to the error. In one embodiment, redundancy is used if the data word contains an error which cannot be corrected by error correction code.

DETAILED DESCRIPTION

The invention relates to reducing memory failures. The invention can be applicable to, for example, various types of processing systems. A system can include, for example, a processor which accesses one or more memory ICs. Alternatively, the processor and the memory array can be integrated into a single IC, such as a system on a chip (SOC). one embodiment, the memory array can include volatile or non-volatile memory cells.

Figure 1:
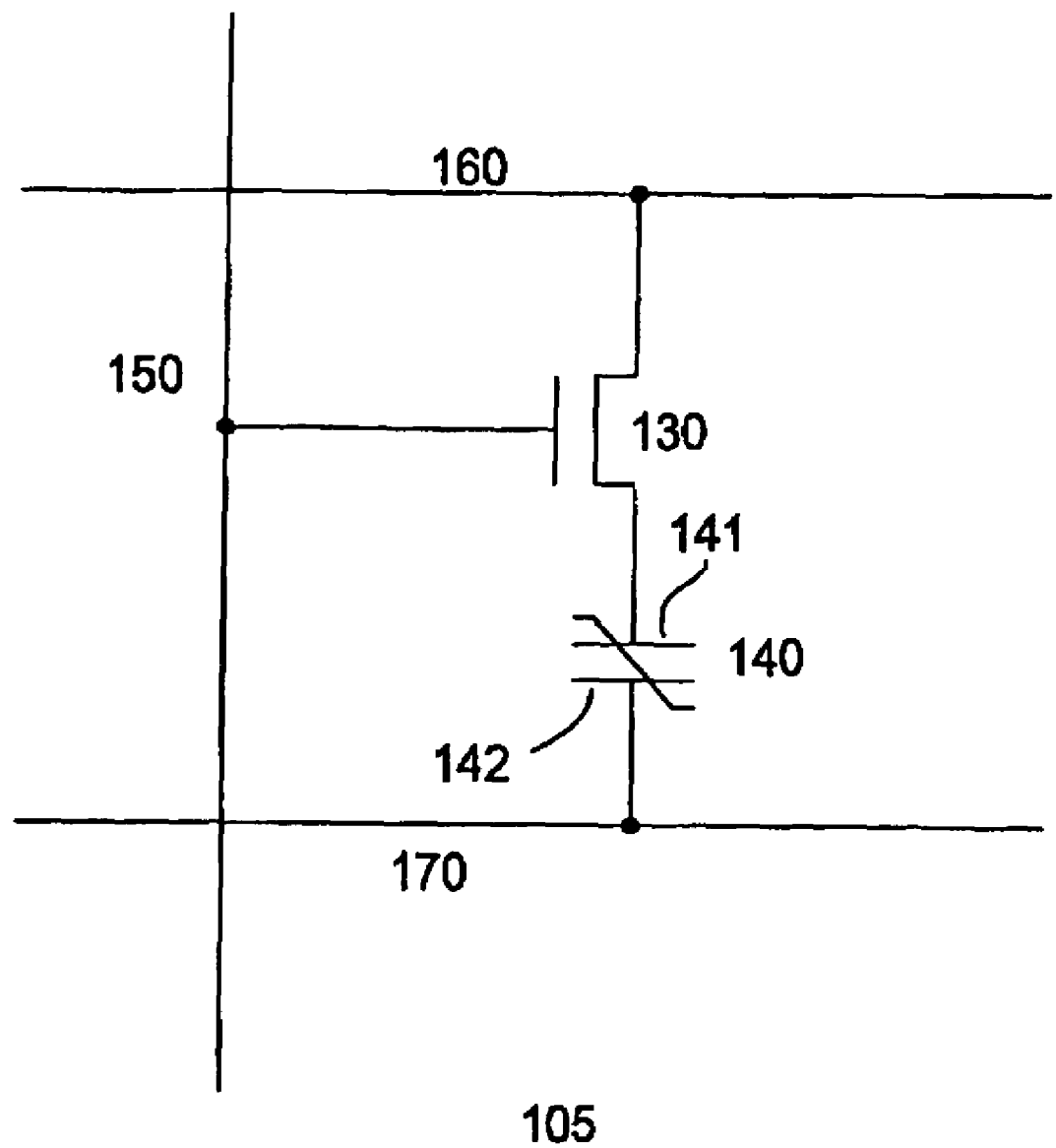
FIG. 1 shows a ferroelectric memory cell.

In one embodiment, the memory array comprises non-volatile memory cells. Other types of memory cells are also useful. Preferably, the nonvolatile memory cells are ferroelectric memory cells, such as those described in FIG. 1. The memory cells can be arranged in a folded or open bitline architecture. Other types of memory architectures, such as series architectures, are also useful. Series architectures are described in, for example, US patent titled "Semiconductor Memory Device and Various Systems Mounting Them", U.S. Pat. No. 5,903,492, filed on Jun. 10, 1997,which is herein incorporated by reference for all purposes.

Figure 2:
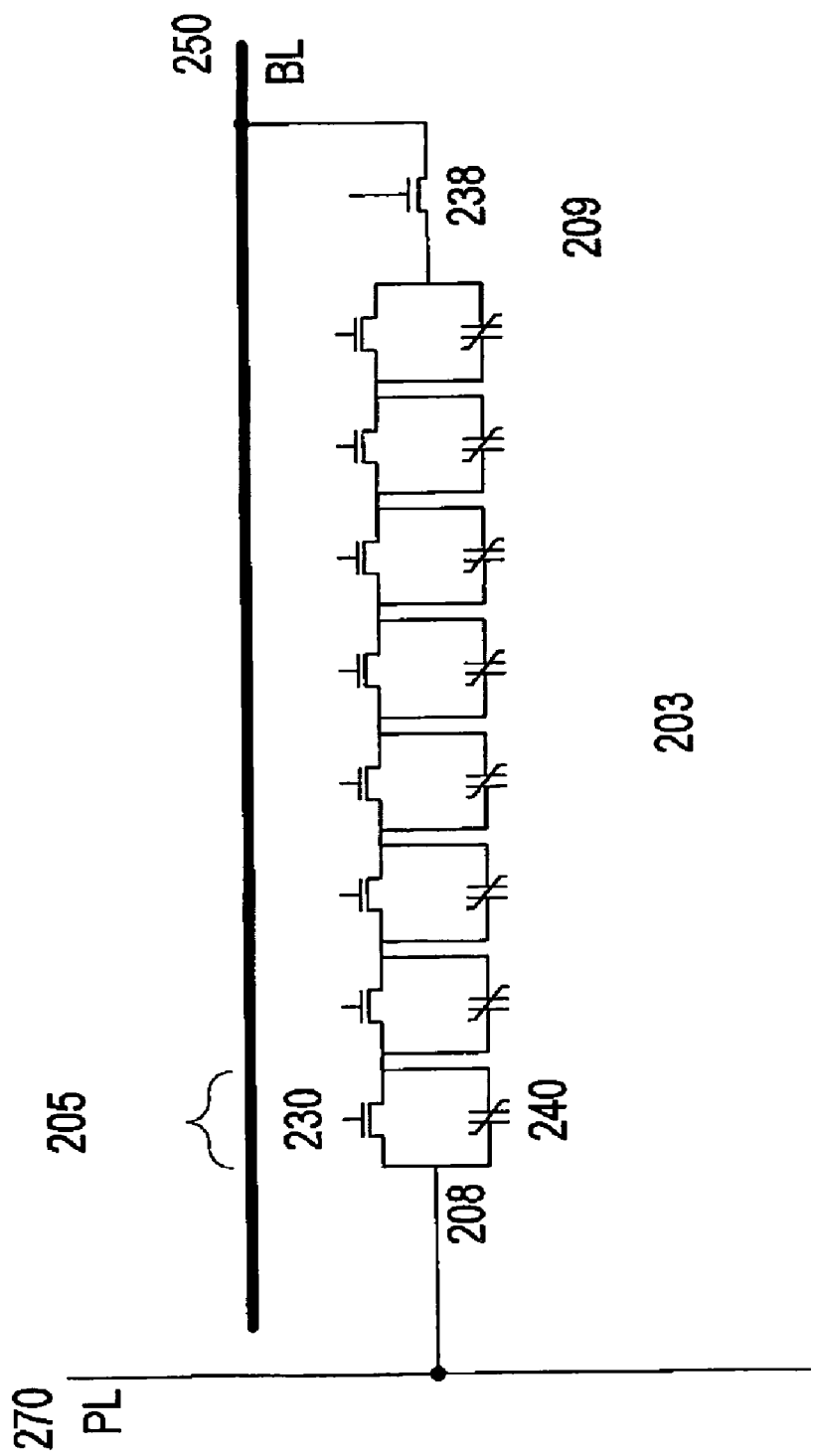
FIG. 2 shows a group of ferroelectric memory cells arranged in a series architecture.

Referring to FIG. 2, a group 203 of memory cells 205 is arranged in a series architecture. The memory cells of the group, each comprising a transistor 230 coupled to a capacitor 240 in parallel, are coupled in series. One end 209 of a group is coupled to a bitline 250 via, for example, a select transistor 238 while the other end 208 is coupled to a plateline 270. The gates of the transistors are coupled to respective wordlines.

To form an array, a plurality of cell groups are interconnected by wordlines, bitlines and plateline(s). The array can be divided into blocks or subarrays. The bitlines are coupled to a sense amplifier circuit to facilitate memory accesses (e.g., reads and writes). Generally, a pair of bitlines is coupled to a sense amplifier, forming a column in the array. The array can be configured to output the number of bits equal to a data word. Other array architectures or configurations are also useful.

As previously described, ECC is used to enhance reliability of memory by correcting errors detected in a retrieved data word. However, when ECC capabilities are exceeded (e.g., number of erroneous bits in the data word exceeds the number of erroneous bits correctable by ECC), a failure occurs. A parity bit can be employed to determine when ECC capabilities are exceeded. Other techniques for determining when ECC capabilities are exceeded can also be used. In accordance with one embodiment of the invention, ECC capabilities are extended by the use of redundancy to repair defective memory cells.

In one embodiment of the invention, a redundancy unit is provided, for example, in the IC. The redundancy unit is preferably associated with a memory array. For memory architectures in which the array is divided into blocks, the redundancy unit can be used to repair defects in all the blocks. Alternatively, a redundancy unit can be associated with each block or some of the blocks. For memory ICs, it is preferable that each IC includes its own redundancy unit.

Providing redundancy at the system level can also be useful. The redundancy unit repairs defective memory cells at addresses corresponding to errors identified by ECC. Preferably, the redundancy unit repairs defective memory cells at addresses corresponding to errors identified by ECC but could not be corrected by ECC. Repairing of defective memory cells can be achieved before or after packaging of the IC.

Figure 3:
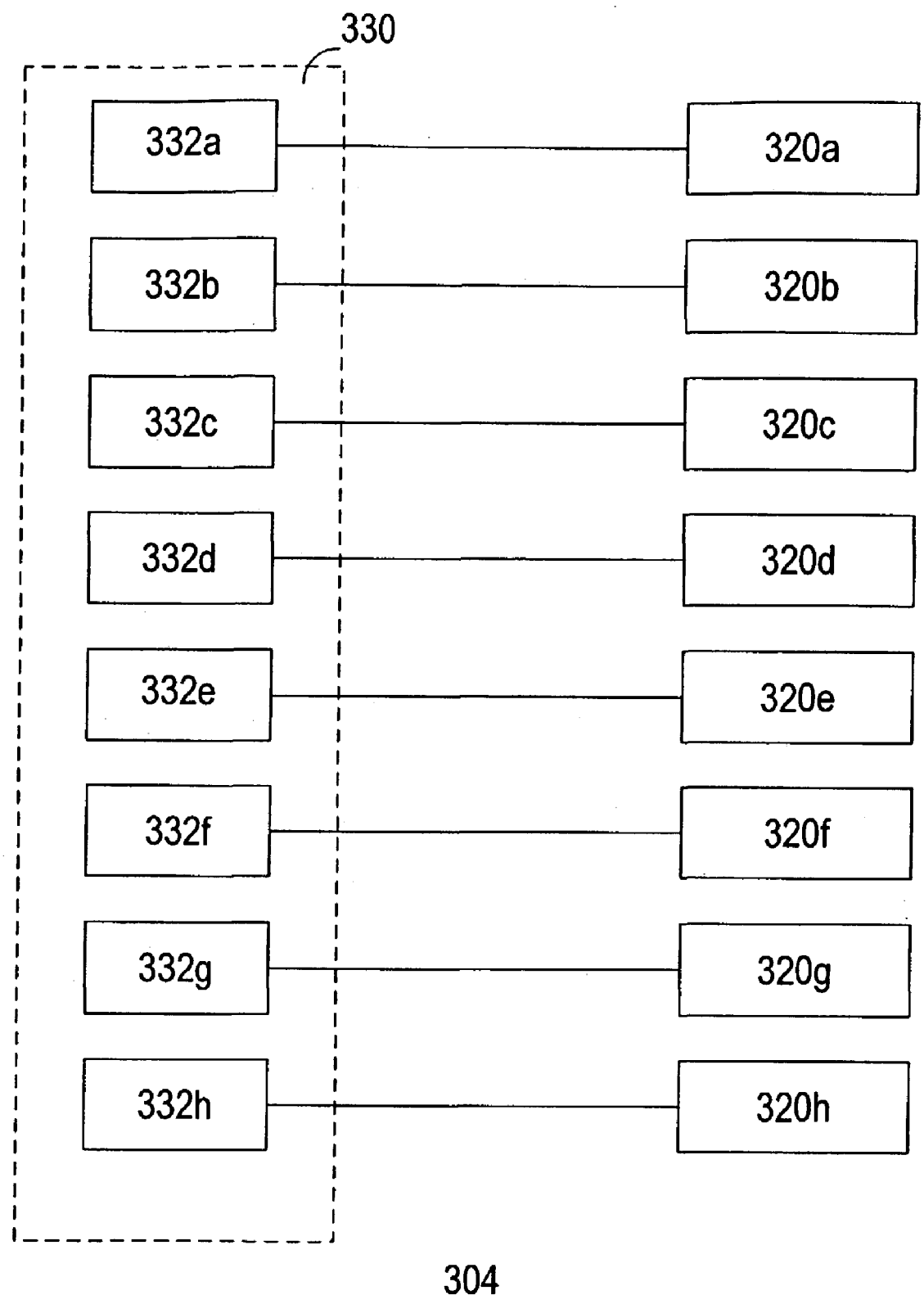
FIG. 3 shows a redundancy block in accordance with one embodiment of the invention.

FIG. 3 shows a redundancy block 304 used for redundancy in accordance with one embodiment of the invention. As shown, the redundant block comprises at least one redundant element 320. Preferably, the redundant unit comprises a plurality of redundant elements 320a –h. The number of redundant elements, for example, depends of design specification and requirements. Typically, the number of redundancy elements is about 4–6% of the size of the memory. Other number of redundant elements is also useful. Preferably, the number of redundant elements is selected to meet design specifications or requirements. A redundant element can comprise a plurality of memory cells for row and/or column redundancy. The memory cells of the redundant elements preferably are of the type as those they are intended to replace (e.g., same type of memory cells as the main array). The granularity of the redundant element can be chosen to accommodate design needs. For example, a redundant element can be designed to replace a group of rows, columns, or cells. The redundant element can also be designed to replace a single memory cell.

Typically, the memory array is separated into memory elements corresponding to the redundant elements. When a defect occurs in a memory element, it is replaced with a redundant element. Each redundant element is associated with a fuse block 332 from a fuse bank 330. As used herein, a redundant element and associated fuse block is referred to as a "redundancy unit". A fuse block includes a plurality of fuses to facilitate redundancy. The use of fuses to facilitate redundancy is described in, for example, Taylor et al., IEEE JSSC, Vol. SC-20, No. 5 (October, 1985), which is herein incorporated by reference for all purposes. The fuses are programmed with the address of the defective memory element which is to be replaced by the redundant element.

Figure 4:
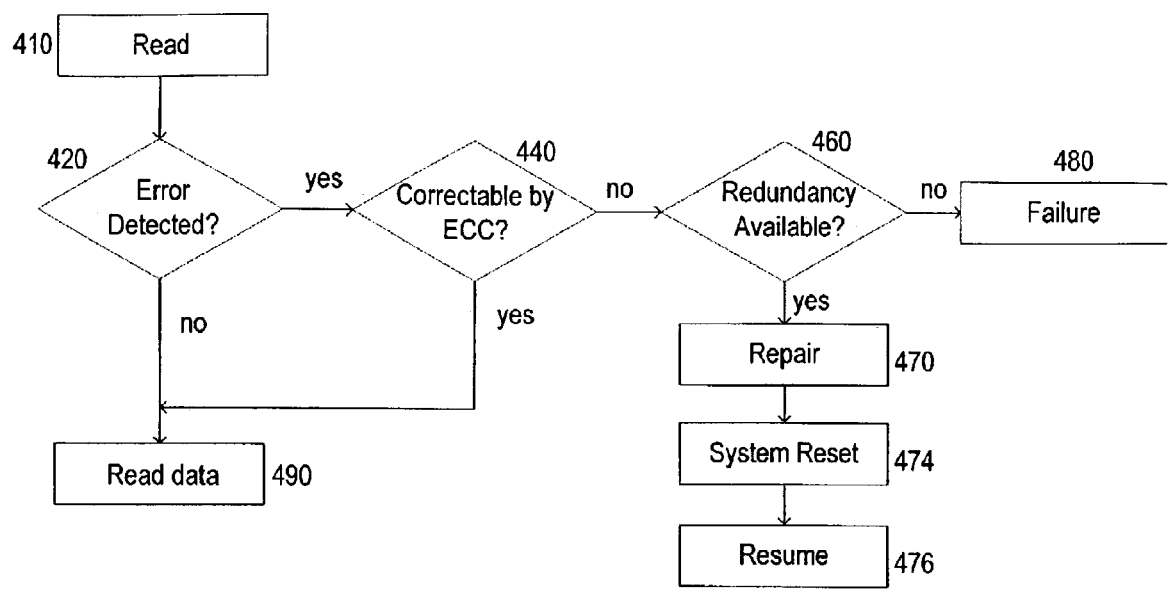
FIG. 4 shows a process for reducing memory failures in accordance with one embodiment of the invention.

FIG. 4 shows a process for reducing memory failures in accordance with one embodiment of the invention. In one embodiment, requestor initiates a read operation to the memory array at step 410. The requester, for example, comprises a processor which is performing a desired process. The process, for example, is a process executed during normal operation of the processor. Alternatively, the process could be a self-test performed using a built in self-test module. Other types of processes, such as self-test performed, for example, during start up or in test mode can also be useful. The requestor and memory array can be integrated into a single chip, such as a SOC. Alternatively, the requestor and memory array are interconnected by buses. They can be located on the same or on different circuit boards. Other types of arrangements are also useful.

When a read is initiated, a read address is generated. The read address is decoded by, for example, support circuitry associated with the memory array. A word of data corresponding to the decoded read address is output from the memory array. At step 420, the read data is checked using ECC techniques to determine whether an error has occurred. The error can be caused by, for example, one or more defective memory cells associated with the read address. In one embodiment, the ECC is performed by an ECC module. The ECC module, for example, is part of the support circuitry or function of the memory array or memory IC. Providing an ECC module which is part of the process or processing system is also useful.

In one embodiment, the ECC comprises Hamming Code. Other ECC techniques, such as Reed-Solomon or Viterbi codes are also useful. The error correction capabilities of the ECC depend on the particular type of ECC employed. For example, the ECC can be designed to correct for a single-bit error in the data word. Implementing an ECC which can correct for double-bit or other number of bit error can also be useful. The ECC can be implemented in hardware, software, or a combination of both.

When no error is detected by the ECC, the read data is provided to the requestor at step 490. On the other hand, if an error is detected (e.g., parity bit is set), ECC determines whether the error can be corrected at step 440. If the error in the data word can be corrected, it is corrected by ECC. The corrected data word is then provided to, for example, the requester.

In the event that the error cannot be corrected by ECC, the requestor checks the redundancy block if redundant elements are available to repair defective cell or cells associated with the read address at step 460. Checking the redundancy block can be achieved by initiating logic or circuitry which determines the availability of redundancy elements. If no redundant element is available, a system failure would be indicated at step 480.

On the other hand, if redundant elements are available, the defective cells are replaced with redundant element or elements in step 470. Various techniques for redundancy to repair the defective cells can be employed. For example, column redundancy can be employed to replace the defective word. Alternatively, bitwise replacement can also be useful. After the defective word or cells are successfully replaced, the system is reset at step 474 and resumes operation at step 476. Thus, by using redundancy, ECC can be extended to avoid system failures.

In another embodiment, repairing defective memory cells can also be performed, even if the error is correctable. Preferably, the correctable errors are not intermittent errors (e.g., caused by alfa-particles) but permanent errors (e.g., caused by defective memory cells). Permanent errors can be determined by, for example, tracking error addresses. If errors consistently occur at a particular address, this would indicate that the error is caused by a defective cell. Correcting correctable errors can be advantageous since overhead associated with error correction can be avoided, thus improving performance. However, this may require the use of greater number of redundant elements which increases chip size.

As described, the use of ECC and redundancy can reduce memory failures after the IC is packaged. To facilitate redundancy after packaging of IC, the electronic fuses are used. Various types of electronic fuses can be employed. For example, electronic fuses formed from ferroelectric or non-volatile memory cells are useful. Preferably, if non-volatile memory cells are used in the array, the fuses are formed from the same type of non-volatile memory cells. Other types of electronic fuses, such as anti-fuses, are also useful. Alternatively, hybrid type fuse blocks which include both electronic and laser type fuses can be used. Such hybrid fuses are described in, for example, U.S. patent application titled "Improved Ferroelectric Memory Architecture", U.S. Ser. No. 10/065,125, filed on Sep. 19, 2002, which is herein incorporated by reference for all purposes.

Repairing defective memory cells can also be performed at the wafer level (e.g., prior to packaging) using the process described in FIG. 4. For example, the memory array can be tested with ECC prior to packaging. Testing can be achieved using, for example, testers. The ECC should have the same or lower capabilities than the ECC used in normal operation. Preferably, the ECC used in wafer testing should be the same as that used in normal operation. When repairing defective memory cells prior to packaging, laser fuses can be used for the programming the redundant elements. Electronic, hybrids, or a combination of electronic, hybrids, and/or laser fuses are also useful. In another embodiment, repairs can be performed at the wafer level and after packaging. The redundancy block can include a combination of laser, electronic and/or hybrid fuses.

While the invention has been particularly shown and described with reference to various embodiments, it will be recognized by those skilled in the art that modifications and changes may be made to the present invention without departing from the spirit and scope thereof. The of the invention should therefore be determined not with reference to the above description but with reference to the appended claims along with their full scope of equivalents.

The invention claimed is:

1. A method of reducing memory failures in an individual integrated circuit (IC) having an array of memory cells comprising:
    testing the array using error correction code (FCC) prior to packaging;
    repairing defects detected during testing which are not correctable by ECC;
    performing a read operation to a memory address for a memory location in the array after packaging;
    retrieving a data word of information from the memory location in the array corresponding to the memory address;
    determining whether the data word contains an error using ECC;
    when the error is not correctable by ECC, determining availability of a redundancy unit within the IC for repairing a defective memory element corresponding to the error, wherein the redundancy unit includes a fuse block and a corresponding redundant memory element; and
    if a redundancy unit is available, programming the fuse block of the redundancy unit with the memory address of the error to cause the redundant memory element corresponding to the fuse block to replace the defective memory element.

2. The method according to claim 1 wherein the array comprises ferroelectric memory cells.

3. The method according to claim 1 wherein the array comprises memory cells arranged in a folded bitline, open bitline, open-folded bitline, or series architecture.

4. The method according to claim 3 wherein the array comprises ferroelectric memory cells.

5. The method according to claim 1 wherein the repairing comprises using a redundancy block including at least one redundancy unit.

6. The method according to claim 5 wherein the fuse block comprises electronic fuses, the electronic fuses comprising ferroelectric memory cells.

7. The method according to claim 1 wherein the fuse block comprises a hybrid fuse block having a first subfuse block comprising electronic fuses and a second subfuse block comprising laser-blowable fuses.

8. The method according to claim 7 wherein the electronic fuses comprises ferroelectric memory cells.

9. The method according to claim 1 wherein the repairing comprises using a redundancy block including at least one redundancy unit, wherein the fuse block comprises electronic or laser-blowable fuses for programming a memory address associated with the error.

10. The method according to claim 9 wherein the electronic fuses comprise ferroelectric memory cells.

11. The method according to claim 9 wherein the fuse block comprises a hybrid fuse block having a first subfuse block comprising electronic fuses and a second subfuse block comprising laser-blowable fuses.

12. The method according to claim 11 wherein the electronic fuses comprise ferroelectric memory cells.

13. A method of reducing memory failures in an integrated circuit (IC) having an array of memory cells comprising:
    providing the IC wherein the array has been tested using error correction code (ECC) prior to packaging;
    reading data from an address in the array;
    testing data read from the address using ECC;
    if the data contains a non-correctable error using ECC, repairing the memory cells corresponding to the error using redundancy for repairing after packaging if redundancy is available.

14. The method of claim 13 wherein the repairing comprises using a redundancy block including at least one redundancy unit, the redundancy unit includes a redundant memory element associated with a fuse block, the fuse block comprising electronic fuses for programming an address associated with the error.

15. The method according to claim 14 wherein the electronic fuses comprise ferroelectric memory cells.

16. The method according to claim 14 wherein the fuse block comprises a hybrid fuse block having a first subfuse block comprising electronic fuses and a second subfuse block comprising laser-blowable fuses.

17. The method according to claim 16 wherein the electronic fuses comprise ferroelectric memory cells.

18. An integrated circuit (IC) comprising:
    an array of memory cells, the array of memory cells having been tested using error correction code ECC) prior to packaging; and
    redundancy for repairing errors after packaging, wherein the errors are not correctable using ECC.

19. The IC of claim 18 further comprising a redundancy block including at least one redundancy unit, the redundancy unit includes a redundant memory element associated with a fuse block, the fuse block comprising electronic fuses for programming an address associated with the error.

20. The IC of claim 19 wherein the electronic fuses comprise ferroelectric memory cells.

21. The IC of claim 19 wherein the fuse block comprises a hybrid fuse block having a first subfuse block comprising electronic fuses and a second subfuse block comprising laser-blowable fuses.

22. The IC of claim 21 wherein the electronic fuses comprise ferroelectric memory cells.

* * * * *